(12) United States Patent
Noble et al.

(10) Patent No.: US 6,380,581 B1
(45) Date of Patent: *Apr. 30, 2002

(54) DRAM TECHNOLOGY COMPATIBLE NON VOLATILE MEMORY CELLS WITH CAPACITORS CONNECTED TO THE GATES OF THE TRANSISTORS

(75) Inventors: Wendell P. Noble, Milton, VT (US); Eugene H. Cloud, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/259,493

(22) Filed: Feb. 26, 1999

(51) Int. Cl.[7] .............................................. H01L 21/70
(52) U.S. Cl. ........................ 257/314; 257/300; 257/316; 257/317; 257/318; 257/319; 257/320; 257/321
(58) Field of Search .......................... 257/300, 316–321, 257/314

(56) References Cited

U.S. PATENT DOCUMENTS

| | | | |
|---|---|---|---|
| 4,051,354 A | 9/1977 | Choate ........................ 235/312 |
| 4,761,768 A | 8/1988 | Turner et al. ................ 365/201 |
| 4,766,569 A | 8/1988 | Turner et al. ................ 365/185 |
| 5,057,448 A | 10/1991 | Kuroda ........................ 438/258 |
| 5,196,722 A | 3/1993 | Bergendahl et al. ......... 257/304 |
| 5,247,346 A | 9/1993 | Hazani ........................ 257/314 |
| 5,250,857 A | 10/1993 | Miyazaki ..................... 307/449 |
| 5,324,681 A | 6/1994 | Lowrey et al. ................ 437/52 |
| 5,327,380 A | 7/1994 | Kersh, III et al. ........... 365/195 |
| 5,331,188 A | 7/1994 | Acovic et al. ................ 257/298 |
| 5,347,490 A | 9/1994 | Terada et al. ................ 365/219 |
| 5,416,735 A | 5/1995 | Onishi et al. ................ 365/145 |
| 5,591,658 A | 1/1997 | Cacharelis ................... 438/201 |
| 5,595,929 A | 1/1997 | Tseng .......................... 437/52 |
| 5,598,367 A | 1/1997 | Noble et al. ................. 365/149 |
| 5,621,233 A | * 4/1997 | Sharma et al. .............. 257/316 |
| 5,748,530 A | 5/1998 | Gotou et al. ............. 365/185.18 |
| 5,763,913 A | * 6/1998 | Jeong .......................... 257/316 |
| 5,764,096 A | 6/1998 | Lipp et al. ................... 327/434 |
| 5,886,379 A | * 3/1999 | Jeong .......................... 257/319 |
| 5,908,311 A | 6/1999 | Chi et al. .................... 438/258 |
| 5,912,840 A | 6/1999 | Gonzalez et al. ....... 365/185.05 |
| 5,981,335 A | * 11/1999 | Chi ............................ 438/253 |
| 6,015,986 A | * 1/2000 | Schuegraf ................... 257/309 |

OTHER PUBLICATIONS

Abbas, S.A., et al., "N–Channel IGFET Design Limitations Due to Hot Electron Trapping", *Technical Digest*, International Electron Devices Meeting, pp. 35–38, (Dec. 1975).

(List continued on next page.)

*Primary Examiner*—Fetsum Abraham
(74) *Attorney, Agent, or Firm*—Schwegman, Lundberg, Woessner & Kluth, P.A.

(57) ABSTRACT

Structures and methods for novel DRAM technology compatible non volatile memory cells is provided. A non volatile memory cell structure is provided which includes a dynamic random access memory (DRAM) transistor. The non volatile memory cell includes a dynamic random access memory (DRAM) capacitor separated by an insulator layer from the DRAM transistor. An electrical via couples a first plate of the DRAM capacitor through the insulator layer to a gate of the DRAM transistor. The novel DRAM technology compatible non volatile memory cells can be fabricated on a DRAM chip with little or no modification of the DRAM optimized process flow. The novel DRAM technology compatible non volatile memory cells operate with lower programming voltages than that used by conventional non volatile memory cells, yet still hold sufficient charge to withstand the effects of parasitic capacitances and noise due to circuit operation.

40 Claims, 9 Drawing Sheets

OTHER PUBLICATIONS

Bude, J.D., et al., "Secondary Electron Flash—a High Performance, Low Power Flash Technology for 0.35 micrometer and Below", International Electron Devices Meeting, *Technical Digest*, pp. 279–282, (1997).

Choi, J.D., et al., "A Triple Polysilicon Stacked Flash Memory Cell with Wordline Self–Boosting Programming", International Electron Devices Meeting, *Technical Digest*, pp. 283–286, (1997).

Chung, S.S., et al., "Performance and Reliability Evaluations of P–Channel Flash Memories with Different Programming Schemes", International Electron Devices Meeting, *Technical Digest*, pp. 295–298, (1997).

Crowder, S., et al., "Trade–offs in the Integration of High Performance Devices with Trench Capacitor DRAM", Dig. Int. Electron Devices Meeting, Washington, D.C., pp. 45–48, (Dec. 1997).

Forbes, L., et al., "Field Induced Reemission of Electrons Trapped in SiO(2)", *IEEE Trans. on Electron Devices*, ED–26 (11), 1816–1818, (Nov. 1979).

Hodges, D.A., et al., "Analysis and Design of Digital Integrated Circuits", McGraw–Hill, New York, 2nd Ed., pp. 394–396, (1988).

Hwang, N., et al., "Tunneling and Thermal Emission of Electrons from a Distribution of Deep Traps in SiO2", *IEEE Trans on Electron Devices*, 40(6), 1100–1103, (Jun. 1993).

Ishiuchi, H., et al., "Embedded DRAM Technologies", *IEDM Technical Digest*, pp. 33–36, (1997).

Kang, H.K., et al., "Highly Manufacturable Process Technology for Reliable 256 Mbit and 1 Gbit DRAMs", *IEEE*, pp. 635–638, (1994).

Kato, M., et al., "A Shallow–Trench–Isolation Flash Memory Technology with a Source–Bias Programming Method", International Electron Devices Meeting, *Technical Digest*, pp. 177–180, (1996).

Kobayashi, T., et al., "A 0.24–micrometer Cell Process with 0.18–micrometer Width Isolation and 3–D Interpoly Dielectric Films for 1–Gb Flash Memories", International Electron Devices Meeting, *Technical Digest*, pp. 275–278, (1997).

Oashi, T., et al., "16Mb DRAM/SOI Technologies for Sub–1V Operation", International Electron Devices Meeting, *Technical Digest*, pp. 609–612, (1996).

Shen, S., et al., "Novel Self–Convergent Programming Scheme for Multi–Level P–Channel Flash Memory", International Electron Devices Meeting, *Technical Digest*, pp. 287–290, (1997).

Shimizu, K., et al., "A Novel High–Density 5F NAND STI Cell Technology Suitable for 256Mbit and 1Gbit Flash Memories", *IEEE*, pp. 271–274, (1997).

Sunouchi, K., et al., "240nm Pitch 4GDRAM Array MOSFET Technologies with X–ray Lithography", International Electron Devices Meeting, *Technical Digest*, pp. 601–604, (1996).

Togo, M., et al., "A Salicide–Bridged Trench Capacitor with a Double–Sacrificial–Si N –Sidewall (DDS) for High–Performance Logic–Embedded DRAMs", International Electron Devices Meeting, *Technical Digest*, pp. 37–40, (1997).

* cited by examiner

410

FORMING A METAL OXIDE SEMICONDUCTOR FIELD EFFECT TRANSISTOR (MOSFET)

420

FORMING A STACKED CAPACITOR ABOVE A GATE OF THE MOSFET USING A DRAM PROCESS

430

FORMING AN ELECTRICAL CONTACT USING A DRAM PROCESS TO COUPLE THE STACKED CAPACITOR TO THE MOSFET

FIG. 4

810 — APPLYING A VOLTAGE POTENTIAL TO A SOURCE REGION FOR A MOSFET

820 — GROUNDING A TOP PLATE OF A STACKED CAPACITOR WHERE THE BOTTOM PLATE IS ELECTRICALLY COUPLED BY AN ELECTRICAL VIA THROUGH THE INSULATOR LAYER TO A GATE OF THE MOSFET

830 — DISCONNECTING A DRAIN REGION OF THE MOSFET FROM A VOLTAGE SUPPLY

FIG. 8

DRAM TECHNOLOGY COMPATIBLE NON VOLATILE MEMORY CELLS WITH CAPACITORS CONNECTED TO THE GATES OF THE TRANSISTORS

RELATED APPLICATIONS

This application is related to the co-filed and commonly assigned applications, U.S. application Ser. No. 09/261,597, filed Feb. 26, 1999, entitled "Applications for Dram Technology Compatible EEPROM Cells," by Eugene H. Cloud and Wendell P. Noble, U.S. appplication Ser. No. 09/261, 598, filed Feb. 26, 1999, entitled "Dram Technology Compatible Processor/Memory Chips," by Leonard Forbes Eugene H. Cloud, and Wendell P. Noble, and U.S. application Ser. No. 09/261,479, filed Feb. 26, 1999, entitled "ConstructuDram Technology Compatible Non Volatile Memory Cells," by Wendell P. Noble and Eugene H. Cloud which are hereby incorporated by reference and filed on even day herewith.

FIELD OF THE INVENTION

The present invention relates generally to semiconductor integrated circuits and, more particularly, to dynamic random access memory (DRAM) technology compatible non volatile memory cells.

BACKGROUND OF THE INVENTION

With the increasing array density of successive generations of DRAM chips, the attractiveness of merging other functions onto the DRAM process chip also increases. However, any successful merged technology product must be cost competitive with the existing alternative of combining separate chips at the card or package level, each being produced with independently optimized technologies. Any significant addition of process steps to an existing DRAM technology in order to provide added functions such as high speed logic, SRAM or EEPROM becomes rapidly cost prohibitive due to the added process complexity cost and decreased yield. Thus, there is a need for a means of providing additional functions on a DRAM chip with little or no modification of the DRAM optimized process flow.

Among the desired additional functions, incorporating non volatile memory capability into a DRAM process flow is one area for which the differences between the separately optimized technologies is the greatest. Electronically erasable and reprogrammable read only memory (EEPROM) cells represent one form of non-volatile memory. EEPROM cells can be electrically programmed, erased, and reprogrammed. The typical EEPROM cell consists of a MOSFET with two stacked gates, a floating gate directly over the device channel and a control gate atop and capacitively coupled to it. Since the floating gate is electrically isolated, any charge stored on the floating gate is trapped. Storing sufficient negative charge on the floating gate will suppress the creation of an inversion channel between source and drain of the MOSFET. Thus, the presence or absence of charge on the floating gate represents two distinct data states. Or the level of change represents a plurality of data states.

Typically, EEPROM cells are selectively programmed by hot electron injection which places a negative charge on a floating gate during a write. The EEPROM cells are selectively erased by Fowler-Nordheim tunneling which removes the a charge from the floating gate. During a write, a high programming voltage is placed on the control gate. This forces an inversion region to form in the p-type substrate. The drain voltage is increased to approximately half the control gate voltage (6 volts) while the source is grounded (0 volts), increasing the voltage drop between the drain and source. In the presence of the inversion region, the current between the drain and source increases. The resulting high electron flow from source to drain increases the kinetic energy of the electrons. This causes the electrons to gain enough energy to overcome the outside barrier and collect on the floating gate.

After the write is completed, the negative charge on the floating gate raises the cell's threshold voltage (Vt) above the wordline logic 1 voltage. When a written cell's wordline is brought to a logic 1 during a read, the MOSFET in the EEPROM cell will not turn on. Sense amps detect and amplify the cell current, and output a 0 for a written cell.

The floating gate can be erased by grounding the control gate and raising the source voltage to a sufficiently high positive voltage to transfer electrons out of the floating gate to the source terminal of the transistor by tunneling through the insulating gate oxide. After the erase is completed, the lack of charge on the floating gate lowers the cell's Vt below the wordline logic 1 voltage. Thus when an erased cell's wordline is brought to a logic 1 during a read, the transistor will turn on and conduct more current than a written cell. Some EEPROM cells use Fowler-Nordheim tunneling for writes as well as erase.

The EEPROM cells can be selectively reprogrammed in the same manner as described above, since the Fowler-Nordheim tunneling process is nondestructive. The programming and erasure voltages which effect Fowler-Nordheim tunneling are higher than the voltages normally used in reading the memory. Thus the Fowler-Nordheim tunneling effect is negligible at the lower voltages used in reading the memory, allowing a EEPROM cell to maintain its programmed state for years if subjected only to normal read cycles.

The programming voltages required for EEPROM operation pose an additional problem to merging EEPROM and DRAM chip technologies. The EEPROM cell includes a capacitor plate which must be fabricated with a large enough area to retain a charge sufficient to withstand the effects of parasitic capacitances and noise due to circuit operation. The increased cell array density found on DRAM chips places significant constraints on the size of the EEPROM capacitor plate, Typically, smaller cell designs necessitate increasing programming voltages in order to retain required capacitance levels. Increasing the programming voltage, however, increases the power dissipation and future generations of EEPROM cells will require lower power dissipation.

Modem DRAM technologies are driven by market forces and technology limitations to converge upon a high degree of commonality in basic cell structure. For the DRAM technology generations from 4 Mbit through 1 Gbit, the cell technology has converged into two basic structural alternatives; trench capacitor and stacked capacitor. A method for utilizing a trench DRAM capacitor technology to provide a compatible EEPROM cell has been described in U.S. Pat. No. 5,598,367. A different approach is needed for stacked capacitors however.

Thus, there is a need for novel DRAM technology compatible non volatile memory cells. It is desirable that such DRAM technology compatible non volatile memory cells be fabricated on a DRAM chip with little or no modification of the DRAM optimized process flow. It is further desirable that such DRAM technology compatible non volatile memory cells operate with lower programming voltages than that used by conventional non volatile memory cells, yet still hold sufficient charge to withstand the effects of parasitic capacitances and noise due to circuit operation.

SUMMARY OF THE INVENTION

The above mentioned problems for merging other functions onto the DRAM chip as well as other problems are addressed by the present invention and will be understood by reading and studying the following specification. The present invention includes a compact non volatile memory cell structure formed using a stacked DRAM capacitor technology.

In one embodiment a non volatile memory cell structure is provided. The non volatile memory cell includes a dynamic random access memory (DRAM) transistor. The non volatile memory cell includes a dynamic random access memory (DRAM) capacitor separated by an insulator layer from the DRAM transistor. An electrical via couples a first plate of the DRAM capacitor through the insulator layer to a gate of the DRAM transistor.

In another embodiment, an array of non volatile memory cells is provided. The array of non volatile memory cells includes a number of non volatile memory cells. Each non volatile memory cell includes a metal oxide semiconductor field effect transistor (MOSFET) formed in a semiconductor substrate. Each non volatile memory cell includes a stacked capacitor which has a bottom plate, a capacitor dielectric, and a top plate. The stacked capacitor is formed in a subsequent layer above the MOSFET and is separated from the MOSFET by an insulator layer. An electrical contact couples the bottom plate of the stacked capacitor to a gate of the MOSFET through the insulator layer. A wordline is coupled to the top plate of the stacked capacitor in the number of non volatile memory cells. A bit line is coupled to a drain region of the MOSFET in the number of non volatile memory cells. And, a sourceline is coupled to a source region of the MOSFET in the number of non volatile memory cells.

In another embodiment, a method for forming a non volatile memory cell on a DRAM chip is provided. The method includes forming a metal oxide semiconductor field effect transistor (MOSFET) in a substrate on the DRAM chip. The method includes forming a stacked capacitor above a gate of the MOSFET using a DRAM process. The stacked capacitor is separated from the MOSFET by an insulator layer. An electrical contact is formed using a DRAM process such that the electrical contact couples a bottom plate of the stacked capacitor to the gate of the MOSFET through the insulator layer.

In another embodiment, a method for operating a memory cell is provided. The method includes controlling a charge placed on a gate of a metal oxide semiconductor field effect transistor (MOSFET) and placed on a bottom plate of a stacked capacitor which is coupled to the gate by an electrical contact through an insulator layer. Controlling the charge placed on the gate and on the bottom plate regulates a threshold voltage (Vt) for the memory cell.

These and other embodiments, aspects, advantages; and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

FIG. 4 illustrates, in flow diagram form, a method for forming a non volatile memory cell on a DRAM chip according to the teachings of the present invention.

FIG. 8 illustrates, in flow diagram form, another method for programming a memory device according to the teachings of the present invention.

DESCRIPTION OF THE PREFERRED EMBODIMENTS

Figure 1A:
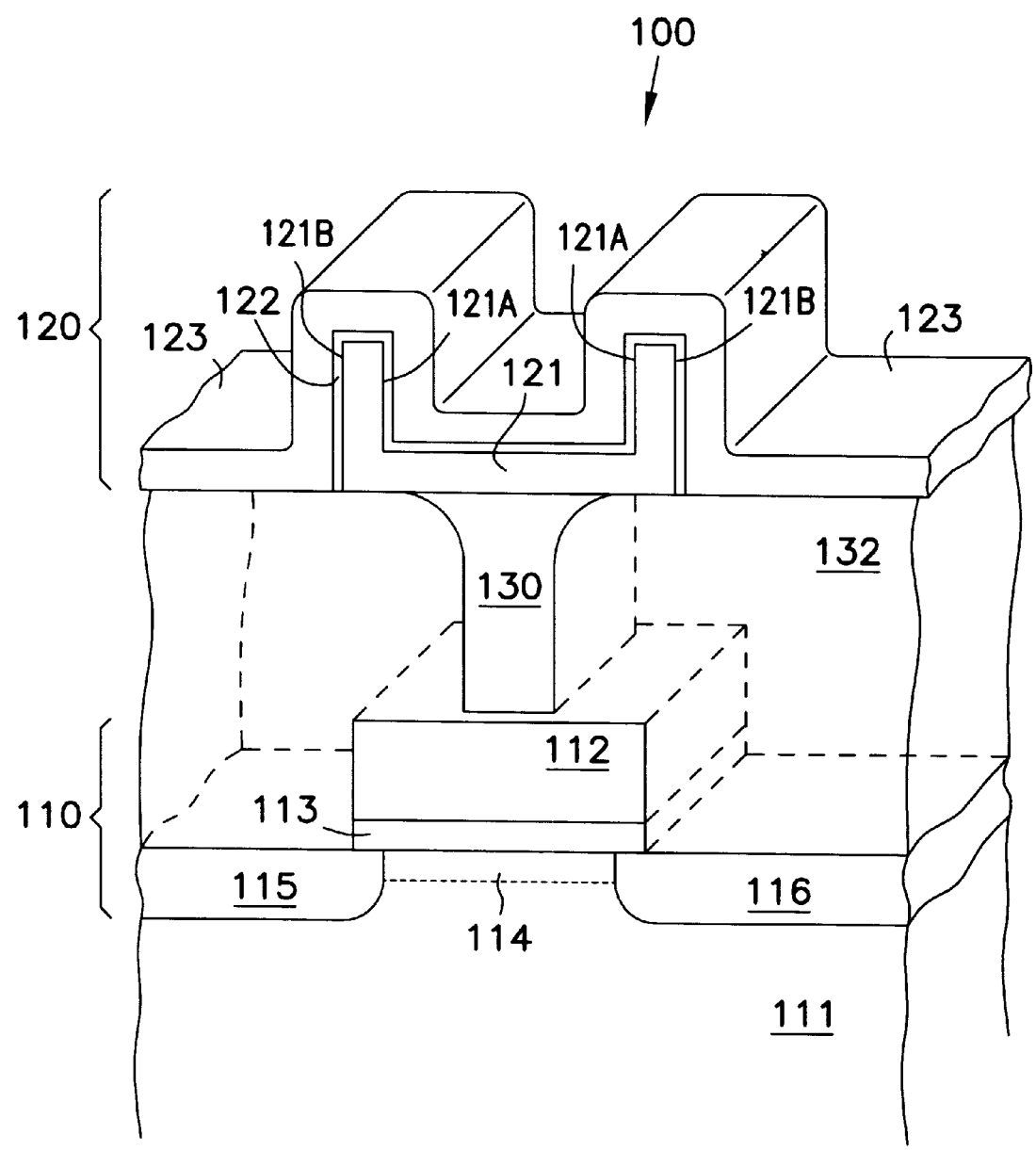
FIG. 1A is a perspective view, illustrating one embodiment of a non volatile memory cell according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer, chip, and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer, chip, and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

In particular, an illustrative embodiment of the present invention includes a non volatile memory cell. The non volatile memory cell includes a dynamic random access memory (DRAM) transistor. The non volatile memory cell includes a dynamic random access memory (DRAM)

capacitor separated by an insulator layer from the DRAM transistor. An electrical via couples a first plate of the DRAM capacitor through the insulator layer to a gate of the DRAM transistor.

In another embodiment of the present invention a non volatile random access memory (NVRAM) is provided. The NVRAM includes a metal oxide semiconductor field effect transistor (MOSFET) formed in a substrate. The NVRAM includes a stacked capacitor formed according to a dynamic random access memory (DRAM) process in a subsequent layer above the MOSFET. The stacked capacitor is separated from the MOSFET by an insulator layer. An electrical contact couples a bottom plate of the stacked capacitor to a gate of the MOSFET. In one embodiment, the electrical contact includes a polysilicon plug and the bottom plate of the stacked capacitor is cup shaped having interior walls and is separated by a dielectric layer from a top plate of the stacked capacitor. The dielectric layer is conformal to the bottom plate and the top plate is conformal to the dielectric layer. A portion of the top plate is located within the interior walls of the bottom plate.

In another embodiment of the present invention, an EEPROM cell is provided. The EEPROM cell includes a metal oxide semiconductor field effect transistor (MOSFET) formed in a semiconductor substrate. The MOSFET has a gate separated by a gate oxide from a channel region. The channel region couples a first diffused region to a second diffused region. The EEPROM cell includes a stacked capacitor formed according to a dynamic random access memory (DRAM) process in a subsequent layer above the MOSFET and separated from the MOSFET by an insulator layer. An electrical via couples a bottom plate of the stacked capacitor through the insulator layer to the gate of MOSFET. In one embodiment, the stacked capacitor includes a double sided stacked type capacitor structure having at least one roughened surface. In an alternative embodiment, the stacked capacitor includes a fin type capacitor structure. The gate oxide has a thickness of less than 100 Angstroms (Å). The stacked capacitor includes a top plate separated from the bottom plate of the capacitor by a capacitor dielectric. The bottom plate of the stacked capacitor comprises a floating gate for the EEPROM cell and the top plate comprises a control gate for the EEPROM cell. In one embodiment, a capacitive coupling ratio (C1/C2) of a capacitance between the-control gate and the floating gate (C1) to a capacitance between the floating gate and the channel region (C2) is greater than 1.0. The capacitor dielectric has a thickness of less than 100 Å.

In another embodiment, a non volatile memory array is provided. The non volatile memory array includes a number of non volatile memory cells. Each non volatile memory cell includes a metal oxide semiconductor field effect transistor (MOSFET) formed in a semiconductor substrate. Each non volatile memory cell includes a stacked capacitor which has a bottom plate, a capacitor dielectric, and a top plate. The stacked capacitor is formed in a subsequent layer above the MOSFET and is separated from the MOSFET by an insulator layer. An electrical contact couples the bottom plate of the stacked capacitor to a gate of the MOSFET through the insulator layer. A wordline is coupled to the top plate of the stacked capacitor in the number of non volatile memory cells. A bit line is coupled to a drain region of the MOSFET in the number of non volatile memory cells. And, a sourceline is coupled to a source region of the MOSFET in the number of non volatile memory cells. The non volatile memory array is formed on a DRAM chip. In one embodiment, the non volatile memory array includes an array of electrically erasable and programmable read only memories (EEPROMs). In an alternative embodiment, the non volatile memory array includes an array of flash memory cells.

In another embodiment of the present invention, an electronic system is provided. The electronic system includes a processor and a dynamic random access memory (DRAM) chip. A system bus couples the processor to the DRAM chip. The DRAM chip includes a non volatile memory array. The non volatile memory array includes a number of non volatile memory cells. Each non volatile memory cell includes a metal oxide semiconductor field effect transistor (MOSFET) formed in a semiconductor substrate. Each non volatile memory cell includes a stacked capacitor. The stacked capacitor has a bottom plate, a capacitor dielectric, and a top plate. The stacked capacitor is formed in a subsequent layer above the MOSFET and is separated from the MOSFET by an insulator layer. Each non volatile memory cell includes an electrical contact coupling the bottom plate of the stacked capacitor to a gate of the MOSFET through the insulator layer. A wordline is coupled to the top plate of the stacked capacitor in the number of non volatile memory cells. A bit line is coupled to a drain region of the MOSFET in the number of non volatile memory cells. And, a sourceline is coupled to a source region of the MOSFET in the number of non volatile memory cells.

In another embodiment of the present invention, a method for forming a non volatile memory cell on a DRAM chip is provided. The method includes forming a metal oxide semiconductor field effect transistor (MOSFET) in a substrate on the DRAM chip. The method includes forming a stacked capacitor above a gate of the MOSFET using a DRAM process. The stacked capacitor is separated from the MOSFET by an insulator layer. An electrical contact is formed using a DRAM process such that the electrical contact couples a bottom plate of the stacked capacitor to the gate of the MOSFET through the insulator layer.

In another embodiment, a method for forming a non volatile memory array on a DRAM chip is provided. The method includes forming a plurality of metal oxide semiconductor field effect transistors (MOSFETs) in a semiconductor substrate on the DRAM chip. The method includes forming a plurality of stacked capacitors in an insulator layer above a gate for each of the plurality of MOSFETs using a DRAM process technology. A bottom plate for each of the plurality of stacked capacitors is electrically coupled to the gates of each of the plurality of the MOSFETs using a contact plug formed according to a DRAM process technology. The method includes coupling a wordline to the top plate for each of the stacked capacitors in the plurality of stacked capacitors. A bit line is coupled to a drain region for each of the MOSFETs in the plurality of MOSFETs. The method further includes coupling a sourceline a source region for each of the MOSFETs in the plurality of MOSFETs.

In another embodiment, a method for operating a memory cell is provided. The method includes controlling a charge placed on a gate of a metal oxide semiconductor field effect transistor (MOSFET) and placed on a bottom plate of a stacked capacitor which is coupled to the gate by an electrical contact through an insulator layer. Controlling the charge placed on the gate and on the bottom plate regulates a threshold voltage (Vt) for the memory cell.

In another embodiment of the present invention, a method for operating a memory device is provided. The method includes placing a charge on a gate of a metal oxide semiconductor field effect transistor (MOSFET) and placing a charge on a bottom plate of a stacked capacitor. The stacked capacitor is separated from the MOSFET by an insulator layer and an electrical contact couples the bottom plate of the stacked capacitor to the gate of the MOSFET through the insulator layer. The method includes applying a potential to a top plate of the stacked capacitor. The method further includes detecting a current flow between a first diffused region and a second diffused region in the MOSFET.

In another embodiment of the present invention, a method for programming a memory device is provided. The method includes grounding a source region for a metal oxide semiconductor field effect transistor (MOSFET). A control gate voltage is applied to a top plate of a stacked capacitor formed in an insulator layer separating the stacked capacitor from the MOSFET. The stacked capacitor includes a bottom plate separated by a capacitor dielectric from the top plate. The bottom plate is electrically coupled by an electrical via through the insulator layer to a gate of the MOSFET. The method further includes applying a drain voltage of approximately half the control gate voltage to a drain region of the MOSFET such that an electrical charge is placed on the gate of the MOSFET and the bottom plate of the stacked capacitor.

In another embodiment of the present invention, another method for programming a memory device is provided. The method includes applying a voltage potential to a source region for a metal oxide semiconductor field effect transistor (MOSFET). The method includes grounding a top plate of a stacked capacitor formed in an insulator layer which separates the stacked capacitor from the MOSFET. The stacked capacitor includes a bottom plate separated by a capacitor dielectric from the top plate. The bottom plate is electrically coupled by an electrical via through the insulator layer to a gate of the MOSFET. The method further includes disconnecting a drain region of the MOSFET from a voltage supply such that the method removes an electrical charge from the gate of the MOSFET and removes an electrical charge from the bottom plate of the stacked capacitor.

FIG. 1A is a perspective view, illustrating one embodiment of a non volatile memory cell 100, a non volatile random access memory (NVRAM) 100, an electrically erasable and programmable read only memory cell (EEPROM) 100, or FLASH memory cell, according to the teachings of the present invention. The non volatile memory cell structure 100 includes a MOSFET 110 and a capacitor 120 fabricated using conventional DRAM process steps. In one embodiment, the MOSFET 110 includes an n-channel metal oxide semiconductor (NMOS) transistor 110 formed in a semiconducting substrate 111. The MOSFFT 110 includes a gate 112 separated by a gate oxide 113 from a channel region 114 of the MOSFET 110. In one embodiment, the gate oxide 113 has a thickness of less than 100 Angstroms (Å) and acts as a tunneling oxide. Gate 112 includes a polysilicon gate 112, a polycide gate 112, salicded gate structure, or other conductive gate material as known to one of ordinary skill in the art of DRAM transistor fabrication. The channel region 114 couples a first diffused region 115 to a second diffused region 116. The DRAM transistor is formed according to a conventional, DRAM optimized process flow, as is known to those of ordinary skill in the art of DRAM chip fabrication.

As shown in FIG. 1A, the capacitor 120 is formed in a subsequent layer above the MOSFET 110. The capacitor 120 is separated from the transistor by an insulator layer 132. Capacitor 120 includes a bottom plate 121 and a top plate 123 which is separated from the bottom plate 121 by a dielectric layer or a control gate insulator, or capacitor dielectric 122. The bottom plate 121 serves as a storage node 121 and the top plate serves as a plate capacitor 123 for the capacitor 120. The bottom plate 121 comprises a floating gate 121 for the non volatile memory cell 100 which is connected through 130 to gate 112. Entire stack 121, 130 and 112 is a floating gate. The top plate 123 comprises a control gate 123 for the non volatile memory cell 100. In one embodiment, shown in FIG. 1A, capacitor 120 includes a stacked capacitor which is cup shaped 120. The bottom plate 121 has interior walls 121A and exterior walls 121B. The capacitor dielectric 122 is conformal to the interior walls 121A and the exterior walls 121B of the bottom plate 121. The top plate 123 is conformal to the capacitor dielectric 122. A portion of the top plate 123 is located within and opposes the interior walls 121A of the bottom plate 121, separated therefrom by the capacitor dielectric 122. A portion of the top plate 123 is locate outside of and opposes the exterior walls 121B of the bottom plate 121, separated therefrom by the capacitor dielectric 122. In one embodiment, the capacitor dielectric has a thickness of less than 100 Angstroms (Å).

Figure 1B:
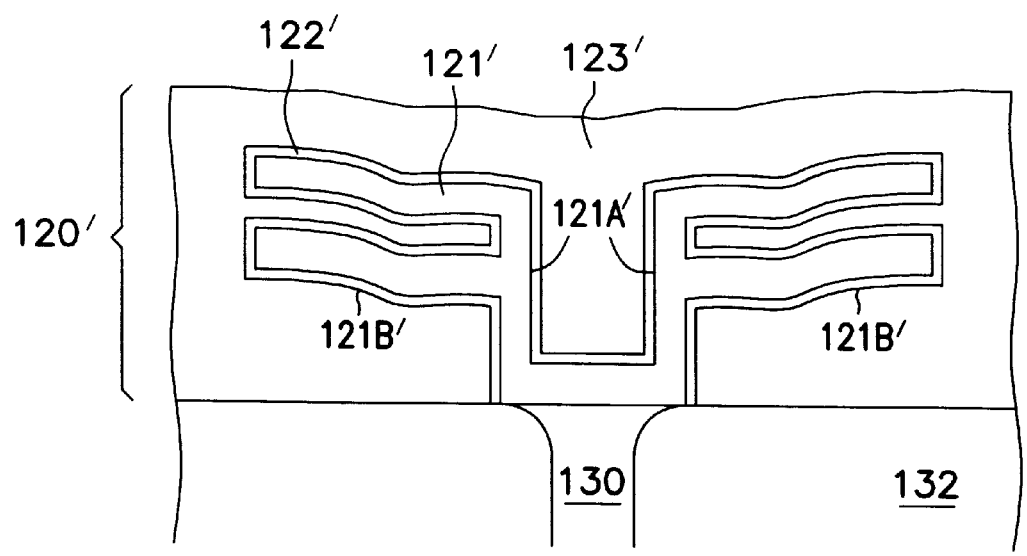
FIG. 1B, illustrates an alternative embodiment of the DRAM capacitor shown in FIG. 1A.

In an alternative embodiment, shown in FIG. 1B, the capacitor includes a fin type stacked capacitor structure 120'. capacitor 120' includes a bottom plate 121' and a top plate 123' which is separated from the bottom plate 121' by a dielectric layer, or capacitor dielectric 122'. The bottom plate 121' serves as a storage node 121' and the top plate serves as a plate capacitor 123' for the capacitor 120'. The bottom plate 121' has interior walls 121A' and exterior walls 121B'. The capacitor dielectric 122' is conformal to the interior walls 121A' and the exterior walls 121B' of the bottom plate 121'. The top plate 123' is conformal to the capacitor dielectric 122'. A portion of the top plate 123' is located within and opposes the interior walls 121A' of the bottom plate 121', separated therefrom by the capacitor dielectric 122'. A portion of the top plate 123' is locate outside of and opposes the exterior walls 121B' of the bottom plate 121', separated therefrom by the capacitor dielectric 122'. In one embodiment, the capacitor dielectric has a thickness of less than 100 Angstroms (Å).

Figure 1C:
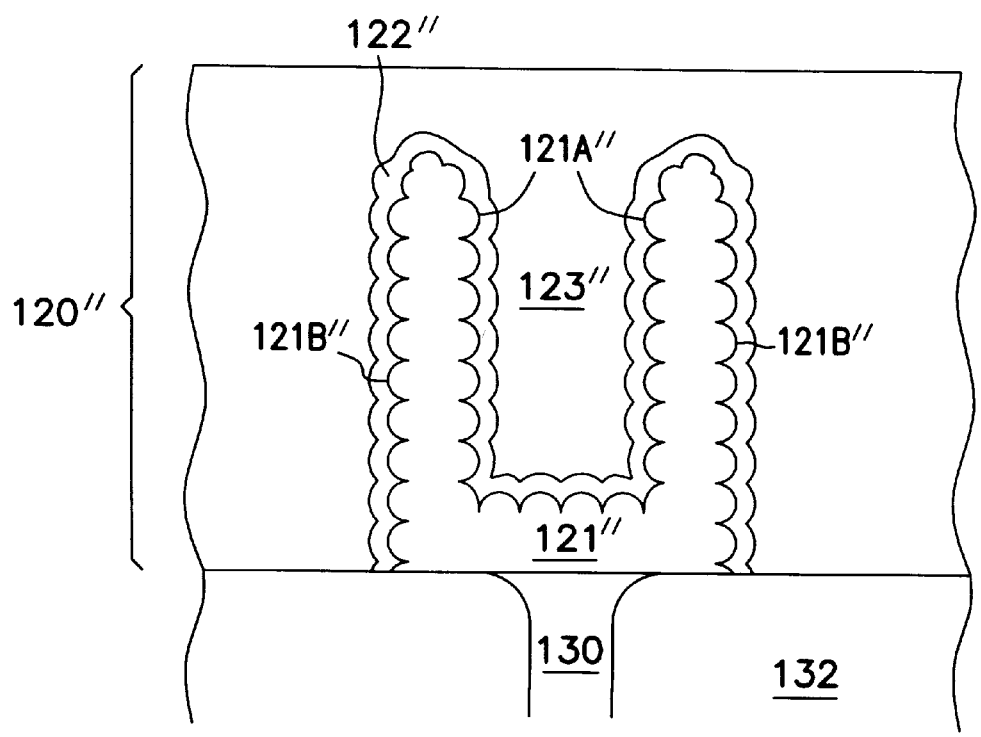
FIG. 1C, illustrates another alternative embodiment of the DRAM capacitor shown in FIG. 1A.

In another alternative embodiment, shown in FIG. 1C, the capacitor includes a double sided stacked type capacitor structure having at least one roughened surface 121". Capacitor 120" includes a bottom plate 121" and a top plate 123" which is separated from the bottom plate 121" by a dielectric layer, or capacitor dielectric 122". The bottom plate 121" serves as a storage node 121" and the top plate serves as a plate capacitor 123" for the capacitor 120". The bottom plate 121" has interior walls 121A" and exterior walls 121B". The capacitor dielectric 122" is conformal to the interior walls 121A" and the exterior walls 121B" of the bottom plate 121". The top plate 123" is conformal to the capacitor dielectric 122". A portion of the top plate 123" is located within and opposes the interior walls 121A" of the bottom plate 121", separated therefrom by the capacitor dielectric 122". A portion of the top plate 123" is locate outside of and opposes the exterior walls 121B" of the bottom plate 121", separated therefrom by the capacitor dielectric 122". In one embodiment, the capacitor dielectric has a thickness of less than the equivalent of 100 Angstroms (Å) of $SiO_2$.

Other known structures for stacked capacitors are included within the scope of the present invention for comprising capacitor 120. The capacitor 120 is formed according to a conventional, DRAM optimized process flow, as is known to those of ordinary skill in the art of DRAM chip fabrication. In one embodiment, a TEOS layer, or $O_3$-TEOS layer is used to form the insulator layer 132, or interlayer dielectric 132, separating the capacitor 120 from the MOSFFT 110. Other insulator layers such as silicon-dioxide ($SiO_2$) or silicon-nitride ($Si_3N_4$) may similarly be substituted as the insulator layer 132.

As shown in FIG. 1A, an electrical via 130, or electrical contact 130, or plug couples the bottom plate 121, or first plate 121, of the capacitor 120 through the insulator layer 132 to the gate 112 of the MOSFET 110. In one embodiment, the electrical contact 130 includes a polysilicon plug 130. Other electrical contacts 130 of suitable conductivity may similarly be employed to form the electrical contact 130 between the bottom plate 121 and the gate 112 through the insulator layer 132. To form the electrical contact 130 through the insulator layer 132, a photoresist layer, or other suitable mask, is deposited on the insulator layer patterned and exposed to form an opening in the mask above the gate 112 of the MOSFET 110. A DRAM etch process is used to create a contact opening through the insulator layer 132 to the gate 112 of the MOSFET 110. In one embodiment, the DRAM etch process includes a reactive ion etch (RIE). Other suitable etches may similarly be employed. A first level interconnection to the gate 112 of the MOSFET 110 is made to form the electrical contact 130 through the insulator layer. In one embodiment, the electrical via 130, or electrical contact 130, is formed using an Aluminum (Al) reflow process and Titanium/Titanium-Nitride (Ti/TiN) as a barrier metal to enhance electromigration and stressmigration resistance in contrast to conventional Al deposition. Alternatively, electrical contact is formed using DRAM chemical vapor deposition (CVD) to create a conductive connection between the bottom plate 121 of the capacitor 120 and the gate 112 of the MOSFET 110 through an opening in the insulator layer 132. In this manner, non volatile memory cell 100, shown in FIG. 1A, is formed entirely according to an optimized process flow. Thus, the lengthy process steps associated with conventional non volatile memory cell fabrication is avoided. Also, the non volatile memory cell 100 structure of the present invention is achievable in the high density DRAM fabrication format of 256 Mbit DRAMs and beyond.

The non volatile memory cell 100 of the present invention may provide a greater capacitive coupling ratio (C1/C2) than conventional non volatile memory cells. The capacitive coupling ratio (C1/C2) is measured as the ratio between the capacitance of the control gate to the floating gate (C1) and the capacitance of the floating gate to the channel region (C2). The capacitive coupling ratio may also be expressed as the ratio of the capacitance between the control gate to the floating gate (C1) and the capacitance of the floating gate to either the first diffused region or the second diffused region (C2). Conventional non volatile memory cells have a capacitive coupling ratio (C1/C2) in the range from 0.6 to 1.0. However, the inherently high capacitor surface area of the capacitor 120, included as part of the non volatile cell 100 of the present invention, may provide a capacitive coupling ratio (C1/C2) many times this.

Figure 2:
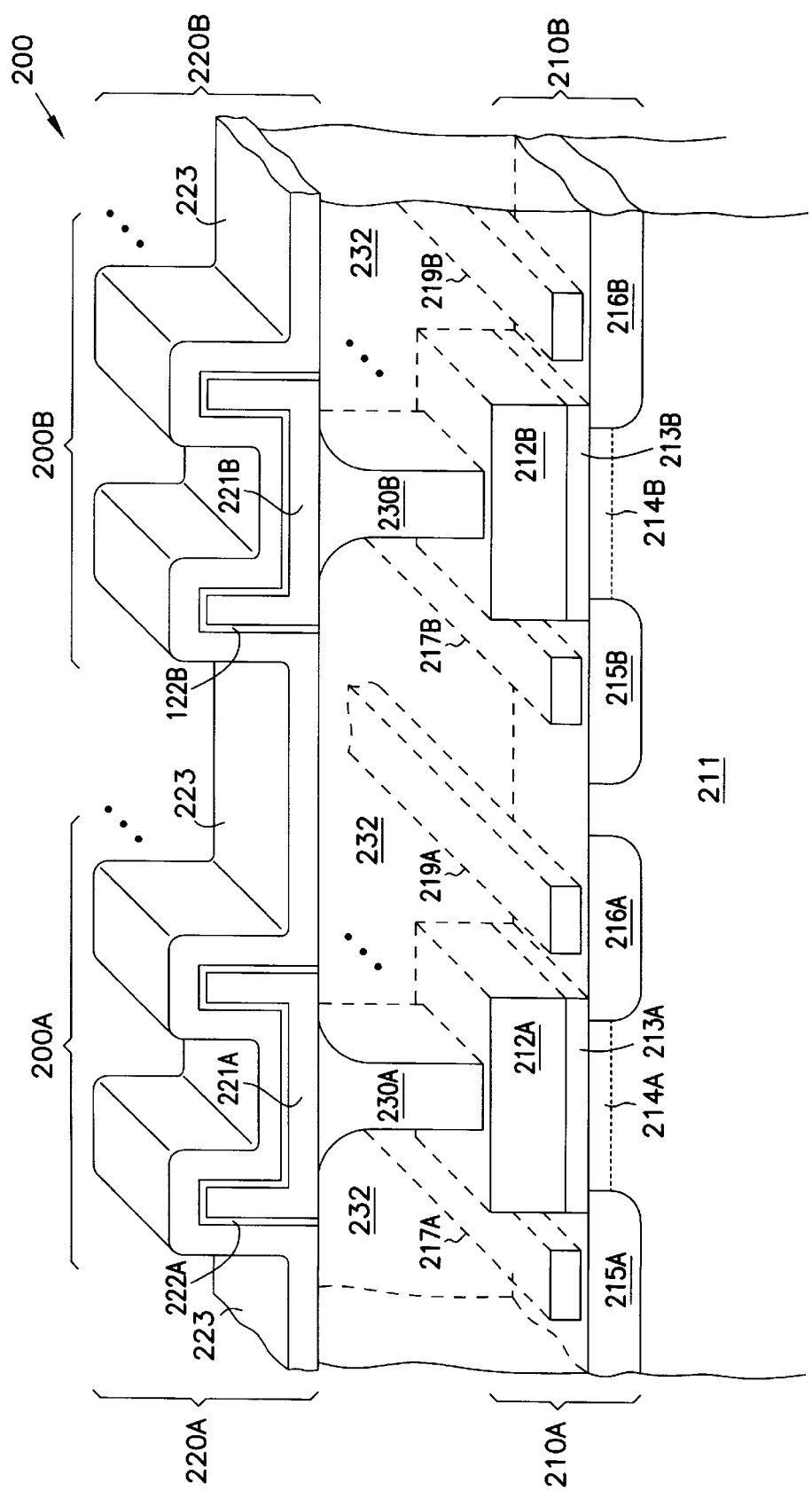
FIG. 2 is a perspective view illustrating a non volatile memory array according to the teachings of the present invention.

FIG. 2 is a perspective view illustrating a non volatile memory array 200 according to the teachings of the present invention. The non volatile memory array 200 includes a number of non volatile memory cells, shown generally as 218A and 218B. Each non volatile memory cell, 200A, 200B etc., includes a metal oxide semiconductor field effect transistor (MOSFET), shown in FIG. 2 as 210A and 210B, formed in a semiconductor substrate 211. Each MOSFET is structured and formed as described above in connection with FIG. 1A. Each non volatile memory cell, 218A, 218B etc., includes a capacitor, shown in FIG. 2 as 220A and 220B which is fabricated using conventional DRAM process steps. Each capacitor is structured and formed as described in detail above in connection with FIGS. 1A, 1B, or 1C. As shown in FIG. 2, the capacitors, 220A, 220B, etc., are formed in a subsequent layer above the MOSFETs, 210A, 210B, etc. respectively. The capacitors, 220A, 220B, etc., are separated from the MOSFETs, 210A, 210B, etc., by an insulator layer 232. An electrical contact couples a bottom plate, 221A, 221B, etc., of each capacitor, 220A, 220B, etc., to a gate, 212A, 212B, etc., for each MOSFET, 210A, 210B, etc., located beneath the capacitors, 220A, 220B, etc. In FIG. 2 the electrical contacts are shown as 230A and 230B respectively. The electrical contacts, 230A, 230B, etc., are structured and formed as described above in detail in connection with FIG. 1A. The electrical contacts, 230A, 230B, etc., couple a bottom plate, 221A, 221B, etc., in each capacitor, 220A, 220B, etc., to the gate, 212A, 212B, etc., for each MOSFET, 210A, 210B, etc., through the insulator layer 232. The insulator layer 232 includes an insulator layer 232 as described in detail above in connection with FIG. 1A.

A top plate 223, shown as a continuous top plate in FIG. 2, serves as a wordline, and control gate 223, for each of the number of non volatile memory cells, 218A, 218B, etc., in the non volatile memory array 200. A bit line, shown in FIG. 2 as 219A or 219B, couples to a drain region, 216A or 216B, of the MOSFET in the number of non volatile memory, 218A, 218B, etc., in the non volatile memory array 200. In one embodiment, the bit line, 219A or 219B, couples the drain region, 216A or 216B, of the MOSFET in a direction orthogonal to the control gate 223 and couples the drain region, 216A or 216B, to other drain regions for MOSFETs, not shown, in a direction perpendicular to the vertical plane. A sourceline, shown in FIG. 2 as 217A or 217B, couples to a source region, 215A or 215B, of the MOSFET in the number of non volatile memory cells, 218A, 218B, etc., in the non volatile memory array 200. In one embodiment, the sourceline, 217A or 217B, couples the source region, 215A or 215B, of the MOSFET in a direction orthogonal to the control gate 223 and couples the source region, 215A or 215B, to other source regions for MOSFETs, not shown, in a direction perpendicular to the vertical. The non volatile memory array 200 may be formed on a DRAM chip 211, or other devices.

In one embodiment, the non volatile memory array 200 includes an array of electrically erasable and programmable read only memories (EEPROMs). In an alternative embodiment, the non volatile memory array 200 includes an array of flash memory cells. The inherently high capacitor surface area of the capacitors, 220A, 220B, etc., included as part of the non volatile memory array 200 of the present invention, provides a capacitive coupling ratio superior to that found in convention non volatile memory arrays.

Figure 3:
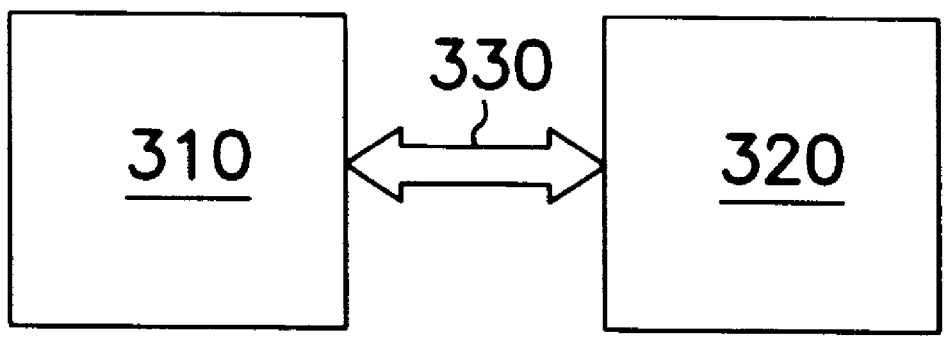
FIG. 3 is a block diagram illustrating an electronic system according to the teachings of the present invention.

FIG. 3 is a block diagram illustrating an electronic system 300 according to the teachings of the present invention. The electronic system 300 includes a processor 310 and a dynamic random access memory (DRAM) chip 320. A system bus 330 couples the processor 310 to the DRAM chip 320. The system bus 330 includes any system bus 330 suitable for transferring data between the processor 310 and the DRAM chip 320. The DRAM chip 320 includes a non volatile memory array as described in detail in connection with FIG. 2.

FIG. 4 illustrates, in flow diagram form, a method for forming a non volatile memory cell on a DRAM chip according to the teachings of the present invention. The method includes forming a metal oxide semiconductor field effect transistor (MOSFET) in a substrate on the DRAM chip 410. The method includes forming a stacked capacitor above a gate of the MOSFET using a DRAM process such that the stacked capacitor is separated by an insulator layer from the MOSFET 420. The method further includes forming an electrical contact using a DRAM process such that the electrical contact couples a bottom plate of the stacked capacitor to the gate of the MOSFET through the insulator layer 430. In one embodiment, forming the electrical contact includes forming a polysilicon plug. In one embodiment, forming a MOSFET in a substrate on the DRAM chip includes forming an n-channel metal oxide semiconductor (NMOS) transistor. In one embodiment, forming a stacked capacitor includes forming a stacked capacitor having a cup-shaped bottom plate with interior walls, a capacitor dielectric conformal to the bottom plate, and a top plate conformal to the capacitor such that a portion of the top plate is located within the interior walls of the bottom plate. The method of FIG. 4 thus provides a non volatile memory cell with an inherently high capacitor surface area for retaining charge. The novel non volatile memory cell operates at lower programming voltages yet still affords a greater capacitive coupling ratio than conventional non volatile memory cells.

Figure 5:
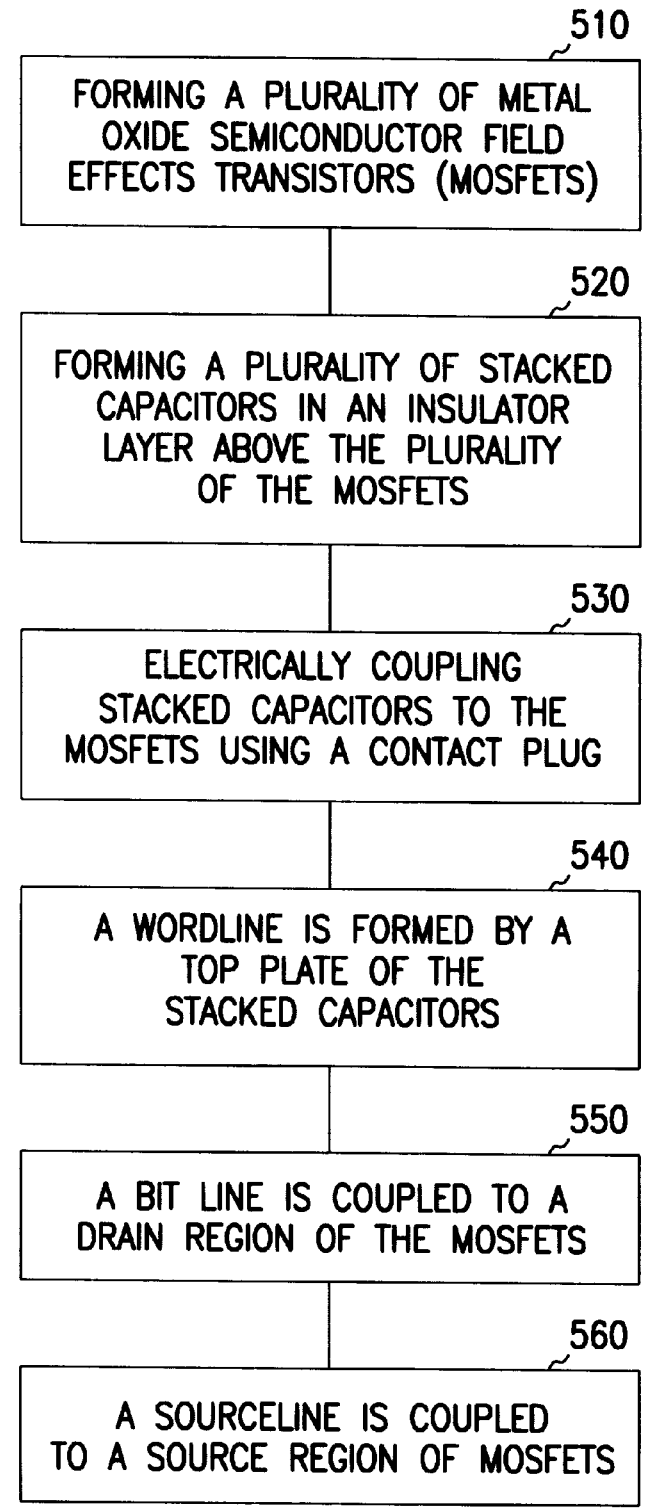
FIG. 5 illustrates, in flow diagram form, a method for forming a non volatile memory array on a DRAM chip.

FIG. 5 illustrates, in flow diagram form, a method for forming a non volatile memory array on a DRAM chip. The method includes forming a plurality of metal oxide semiconductor field effect transistors (MOSFETs) in a semiconductor substrate on the DRAM chip 510. The method includes forming a plurality of stacked capacitors in an insulator layer above a gate for each of the plurality of MOSFETs using a DRAM process technology 520. The method includes electrically coupling a bottom plate for each of the plurality of stacked capacitors to the gates of each of the plurality of the MOSFETS using a contact plug formed according to a DRAM process technology 530. A wordline is coupled to and formed by the top plate for each of the stacked capacitors in the plurality of stacked capacitors 540. A bit line is coupled to a drain region for each of the MOSFETs in the plurality of MOSFETs 550. The method further includes coupling a sourceline a source region for each of the MOSFETs in the plurality of MOSFETs 560. In one embodiment, forming a plurality of stacked capacitors includes forming a plurality of stacked capacitors each having a cup-shaped bottom plate with interior walls, a capacitor dielectric conformal to the bottom plate, and a top plate conformal to the capacitor, and wherein a portion of the top plate is located within the interior walls of the bottom plate.

Method Of Operation

The operation of the novel non volatile memory cells of the present invention is explained in reference to FIG. 2. Programming the novel non volatile memory cells, 218A, 218B, etc., can be achieved through the use of hot electron injection. By this method, the wordline 223 is brought to a high programming voltage, e.g. 2×Vcc. This forces an inversion region to form in the channel regions, shown in FIG. 2 as 214A and 214B, of unprogrammed cells. A voltage of approximately half the wordline 223 voltage is placed on the bit line, 219A and/or 219B which are coupled to drain regions, 216A and/or 216B, of the MOSFETs in the number of non volatile memory cells, 218A, 218B, etc., of the non volatile memory array 200. The sourcelines, shown in FIG. 2 as 217A and 217B, which are coupled to the source regions, 215A and 215B, of the MOSFETs in the non volatile memory array 200 are held at ground. This increases the voltage drop between the source regions, 215A and 215B, and the drain regions, 216A and 216B, for the number of non volatile memory cells, 218A, 218B, etc., in the non volatile memory array 200. In the presence of the inversion region, the current between the source regions, 215A and 215B, and the drain regions, 216A and 216B, respectively increases. The resulting high electron flow from the source regions, 215A and 215B, and the drain regions, 216A and 216B, increases the kinetic energy of the electrons. This causes the electrons to gain enough energy to overcome the gate oxides, 213A and 213B respectively, collect on the gates, 212A and 212B. The gates, 212A and 212B, are coupled by the electrical contacts, 230A and 230B respectively, to the bottom plates, 221A and 221B, for the capacitors, 220A and 220B, in each of the number of non volatile memory cells, 218A, 218B, etc., of the non volatile memory array 200. The electrons are thus trapped on the bottom plates, 221A and 221B, for the capacitors, 220A and 220B.

After the programming is completed, the negative charge on the gates, 212A and 212B, the electrical contacts, 230A and 230B, and the bottom plates, 221A and 221B, for the capacitors, 220A and 220B, in each of the number of non volatile memory cells, 218A, 218B, etc., of the non volatile memory array 200 raises a threshold voltage (Vt) for each of the number of non volatile memory cells, 218A, 218B, etc., of the non volatile memory array 200 above the wordline 223 logic "1" voltage. When a programmed cell's wordline 223 is brought to a logic "1" during a read, the non volatile memory cells, 218A, 218B, etc., will not turn on. Sense amps, not shown detect and amplify the cell current, and output a 0 for a written, or "programmed" cell.

The negative charge on the gates, 212A and 212B, the electrical contacts, 230A and 230B, and the bottom plates, 221A and 221B, for the capacitors, 220A and 220B, can be erased by grounding the wordline/control gate 223 and raising the sourcelines, 217A and 217B, which are coupled to the source regions, 215A and 215B, of the MOSFETs in the non volatile memory array 200 to a sufficiently high positive voltage to transfer electrons out of the gates, 212A and 212B, the electrical contacts, 230A and 230B, and the bottom plates, 221A and 221B, for the capacitors, 220A and 220B to the source regions, 215A and 215B, of the MOSFETs by tunneling through the gate oxides, 213A and 213B respectively. After the erase is completed, the lack of charge on the gates, 212A and 212B, the electrical contacts, 230A and 230B, and the bottom plates, 221A and 221B, for the capacitors, 220A and 220B, lowers the threshold voltage (Vt) for each of the number of non volatile memory cells, 218A, 218B, etc., of the non volatile memory array 200 below the wordline 223 logic "1" voltage. Thus when the wordline 223 of an erased non volatile memory cell, 218A, 218B, etc., wordline is brought to a logic "1" during a read, the non volatile memory cell, 218A, 218B, etc., will turn on and conduct more current than a programmed non volatile memory cell, 218A, 218B, etc. Sense amps, not shown, detect and amplify the current conducted through the non volatile memory cell, 218A, 218B, etc, and output a logic "1" for an unprogrammed, or unwritten, cell. In one embodiment, the method of operation for Fowler Nordheim erase functions is reversed and utilized to program the non volatile memory cells, 218A, 218B, etc. As is appreciated by those skilled in the art, the non volatile memory array 200 will be complemented with other logic architectures to attain high random access memory (RAM) read performance.

Figure 6:
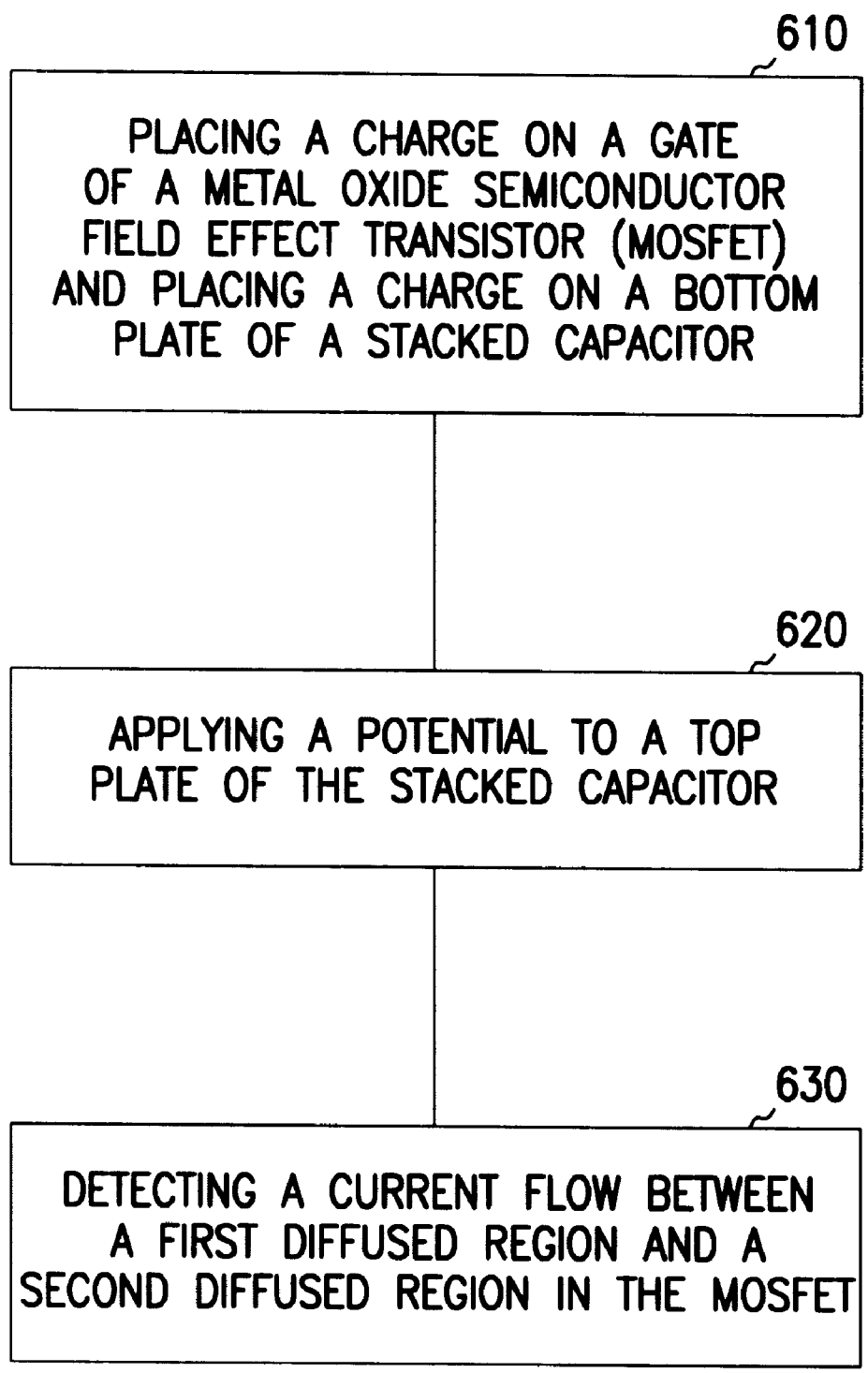
FIG. 6 illustrates, flow diagram form, a method for operating a memory device according to the teachings of the present invention.

FIG. 6 illustrates, in flow diagram form, a method for operating a memory device according to the teachings of the present invention. The method includes placing a charge on a gate of a metal oxide semiconductor field effect transistor (MOSFET) and placing a charge on a bottom plate of a stacked capacitor where the stacked capacitor is separated from the MOSFET by an insulator layer, and where an electrical contact couples the bottom plate of the stacked capacitor to the gate of the MOSFET through the insulator layer 610. The method includes applying a potential to a top plate of the stacked capacitor 620. The method further includes detecting a current flow between a first diffused region and a second diffused region in the MOSFET 630.

Figure 7:
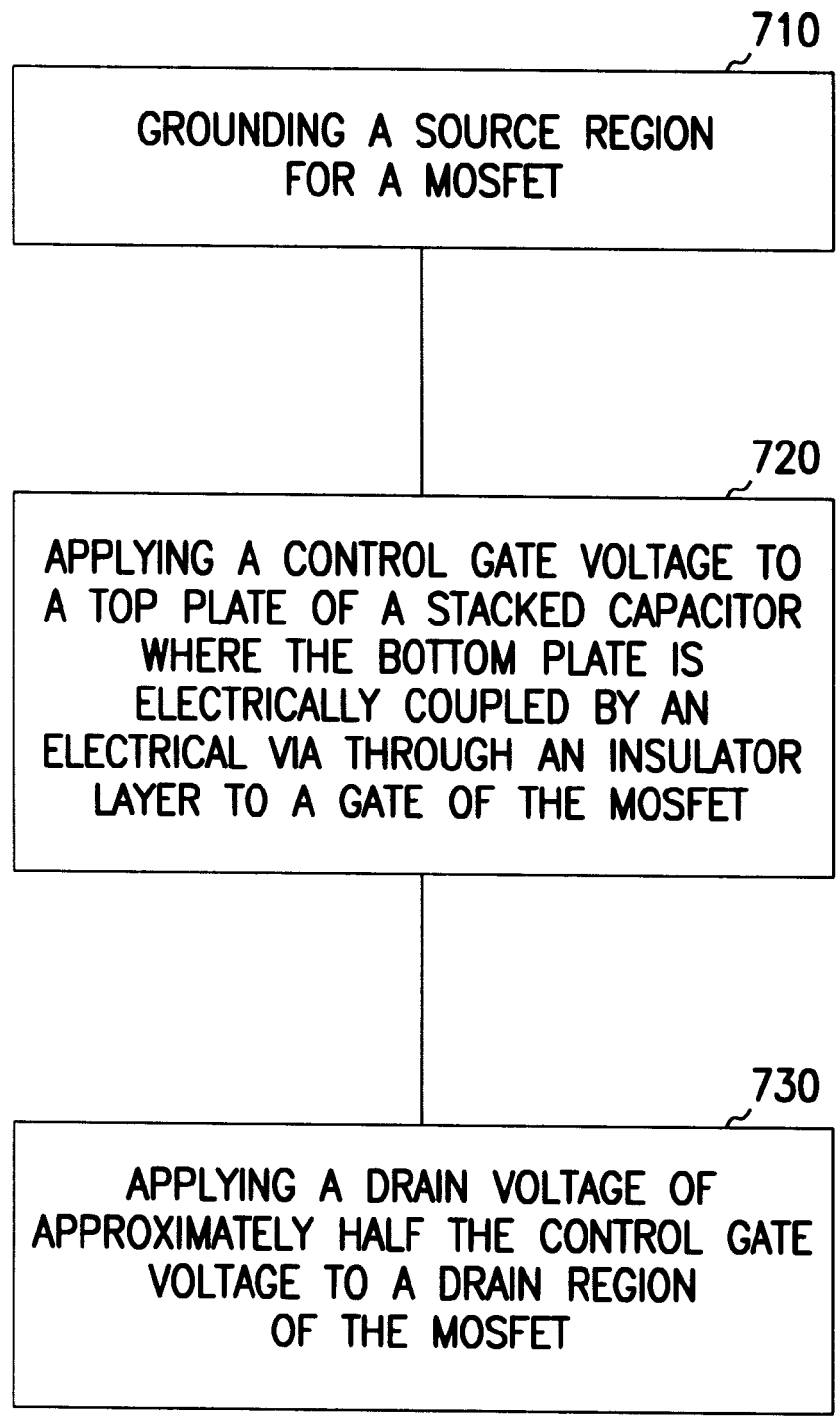
FIG. 7 illustrates, in flow diagram form, a method for programming a memory device according to the teachings of the present invention.

FIG. 7 illustrates, in flow diagram form a method for programming a memory device according to the teachings of the present invention. The method includes grounding a source region for a metal oxide semiconductor field effect transistor (MOSFET) 710. The method includes applying a control gate voltage to a top plate of a stacked capacitor formed in an insulator layer separating the stacked capacitor from the MOSFET where the stacked capacitor includes a bottom plate separated by a capacitor dielectric from the top plate, and where the bottom plate is electrically coupled by an electrical via through the insulator layer to a gate of the MOSFET 720. The method further includes applying a drain voltage of approximately half the control gate voltage to a drain region of the MOSFET such that an electrical charge is placed on the gate of the MOSFET and the bottom plate of the stacked capacitor 730.

FIG. 8 illustrates, in flow diagram form, a method for programming a memory device according to the teachings of the present invention. The method includes applying a voltage potential to a source region for a metal oxide semiconductor field effect transistor (MOSFET) 810. The method includes grounding a top plate of a stacked capacitor formed in an insulator layer separating the stacked capacitor from the MOSFET where the stacked capacitor includes a bottom plate separated by a capacitor dielectric from the top plate, and where the bottom plate is electrically coupled by an electrical via through the insulator layer to a gate of the MOSFET 820. The method further includes disconnecting a drain region of the MOSFET from a voltage supply such that an electrical charge is removed from the gate of the MOSFET and removed from the bottom plate of the stacked capacitor 830.

Conclusion

Thus, structures and methods for novel DRAM technology compatible non volatile memory cells has been provided. The novel DRAM technology compatible non volatile memory cells can be fabricated on a DRAM chip with little or no modification of the DRAM optimized process flow. The novel DRAM technology compatible non volatile memory cells operate with lower programming voltages than that used by conventional non volatile memory cells, yet still hold sufficient charge to withstand the effects of parasitic capacitances and noise due to circuit operation. Hence, the requirements of low power densely packed integrated circuits is realized for smaller, portable devices which utilize non volatile memory cells.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A non volatile memory cell structure, comprising;
    a transistor;
    a capacitor; and
    a vertical electrical via which couples a first plate of the capacitor through an insulator layer to a gate of the transistor, wherein the transistor includes a transistor formed in a semiconductor substrate including a channel and first and a second diffused region in the semiconductor substrate, and wherein a gate for the transistor is separated from the channel by a gate oxide, wherein the capacitor includes a stacked capacitor formed in a subsequent layer above the transistor and separated from the transistor by the insulator layer, wherein the first plate of the stacked capacitor is cup shaped and is separated by a dielectric layer from a second plate of the capacitor.

2. The non volatile memory cell structure of claim 1, wherein the transistor includes an n-channel metal oxide semiconductor (NMOS) transistor.

3. The nonvolatile memory cell structure of claim 1, wherein the transistor includes a transistor formed in a semiconductor substrate including a channel and a first and a second diffused region in the semiconductor substrate, and wherein a gate for the transistor is separated from the channel by a gate oxide.

4. The non volatile memory cell structure of claim 3, wherein the capacitor is separated from the transistor by the insulator layer.

5. A stacked non volatile random access memory (NVRAM), comprising;
    a metal oxide semiconductor field effect transistor (MOSFET) formed in a substrate;
    a stacked capacitor formed according to a dynamic random access memory (DRAM) process in a subsequent layer above the MOSFET and speareated from the MOSFET by an insulator layer; and
    an electrical contact coupling a bottom plate of the stacked capacitor to a gate of the MOSFET, wherein the bottom plate of the stacked capacitor is cup shaped having interior walls and is separted by a dielectric layer from a top plate of the capacitor.

6. The NVRAM of claim 5, wherein the electrical contact includes a polysilicon plug.

7. A stacked non volatile random access memory (NVRAM), comprising:
    a metal oxide semiconductor field effect transistor (MOSFET) formed in a substrate;
    a stacked capacitor formed according to a dynamic random access memory (DRAM) process in a subsequent layer above the MOSFET and separated from the MOSFET by an insulator layer; and
    an electrical contact coupling a bottom plate of the stacked capacitor to a gate of the MOSFET, wherein the bottom plate of the stacked capacitor is cup shaped having interior walls and is separated by a dielectric layer from a top plate of the capacitor, wherein the dielectric layer is conformal to the bottom plate, and wherein the top plate is conformal to the dielectric layer, a portion of the top plate being located within the interior walls of the bottom plate.

8. A stacked non volatile random access memory (NVRAM), comprising:
    a metal oxide semiconductor field effect transistor (MOSFET) formed in a substrate;

a stacked capacitor formed according to a dynamic random access memory (DRAM) process in a subsequent layer above the MOSFET and separated from the MOSFET by an insulator layer; and an electrical contact coupling a bottom plate of the stacked capacitor to a gate of the MOSFET, wherein the bottom plate of the stacked capacitor is cup shaped having interior walls and is separated by a dielectric layer from a top plate of the capacitor, wherein the bottom plate serves as a storage node, and wherein the top plate serves as a plate conductor for the stacked capacitor.

9. The NVRAM of claim 8, wherein the NVRAM includes an electrically erasable and programmable read only memory (EEPROM).

10. The NVRAM of claim 8, wherein the NVRAM includes a flash memory cell.

11. An EEPROM cell, comprising:
a metal oxide semiconductor field effect transistor (MOSFET) formed in a semiconductor substrate, wherein the MOSFET includes a gate separated by a gate oxide from a channel region, and wherein the channel region couples a first diffused region to a second diffused region;

a stacked capacitor formed according to a dynamic random access memory (DRAM) process in a subsequent layer above the MOSFET and separated from the MOSFET by an insulator layer; and an electrical via coupling a bottom plate of the stacked capacitor through the insulator layer to the gate of MOSFET, wherein the bottom plate of the stacked capacitor is cup shaped having interior walls and is separated by a dielectric layer from a top plate of the capacitor, wherein the dielectric layer is conformal to the bottom plate, and wherein the top plate is conformal to the dielectric layer, a portion of the top plate being located within the interior walls of the bottom plate.

12. The EEPROM cell of claim 11, wherein the gate oxide has a thickness of less than 100 Å of $SiO_2$.

13. The EEPROM cell of claim 11, wherein the stacked capacitor includes a top plate separated from the bottom plate of the capacitor by a capacitor dielectric, and wherein the bottom plate of the stacked capacitor comprises a floating gate for the EEPROM cell, and wherein the top plate comprises a control gate for the EEPROM cell.

14. The EEPROM cell of claim 13, wherein a capacitive coupling ratio (C1/C2) of a capacitance between the control gate and the floating gate (C1) to a capacitance between the floating gate and the channel region (C2) is greater than 1.0.

15. The EEPROM cell of claim 13, wherein a capacitive coupling ratio (C1/C2) of a capacitance between the control gate and the floating gate (C1) to a capacitance between the floating gate and either the first diffused region or the second diffused region (C2) is greater than 1.0.

16. The EEPROM cell of claim 13, wherein the capacitor dielectric has a thickness of less than 100 Å $SiO_2$.

17. An EEPROM cell, comprising:
a metal oxide semiconductor field effect transistor (MOSFET) formed in a semiconductor substrate, wherein the MOSFET includes a gate separated by a gate oxide from a channel region, and wherein the channel region couples a first diffused region to a second diffused region;

a stacked capacitor formed according to a dynamic random access memory (DRAM) process in a subsequent layer above the MOSFET and separated from the MOSFET by an insulator layer; and an electrical via coupling a bottom plate of the stacked capacitor through the insulator layer to the gate of MOSFET, wherein the stacked capacitor includes a double sided stacked type capacitor structure having at least one roughened surface.

18. A EEPROM cell, comprising:
a metal oxide semiconductor field effect transistor (MOSFET) formed in a semiconductor substrate, wherein the MOSFET includes a gate separated by a gate oxide from a channel region, and wherein the channel region couples a first diffused region to a second diffused region;

a stacked capacitor formed according to a dynamic random access memory (DRAM) process in a subsequent layer above the MOSFET and separted from the MOSFET by an insulator layer; and an electrical via coupling a bottom plate of the stacked capacitor through the insulator layer to the gate of MOSFET, wherein the stacked capacitor includes a fin type capacitor structure, wherein the fin type capacitor structure includes opposing sides, each of the opposing sides including multiple plates, the multiple plates being separated by a dielectric layer.

19. A non volatile memory array, comprising:
a number of non volatile memory cells wherein each non volatile memory cell includes:
a metal oxide semiconductor field effect transistor (MOSFET) formed in a semiconductor substrate;
a stacked capacitor having a bottom plate, a capacitor dielectric, and a top plate, wherein the stacked capacitor is formed in a subsequent layer above the MOSFET, and wherein the stacked capacitor is separated from the MOSFET by an insulator layer; and
an electrical contact coupling the bottom plate of the stacked capacitor to a gate of the MOSFET through the insulator layer;

a wordline coupled to the top plate of the stacked capacitor in the number of non volatile memory cells;

a bit line coupled to a drain region of the MOSFET in the number of non volatile memory cells; and a sourceline coupled to a source region of the MOSFET in the number of non volatile memory cells, wherein the bottom plate of the stacked capacitor is cup shaped having interior walls, wherein the capacitor dielectric is conformal to the bottom plate, and wherein the top plate is conformal to the capacitor dielectric, a portion of the top plate being located within the interior walls of the bottom plate.

20. The non volatile memory array of claim 19, wherein the non volatile memory array is formed on a DRAM chip.

21. The non volatile memory array of claim 19, wherein the electrical contact includes a polysilicon plug.

22. The non volatile memory array of claim 19, wherein the gate of the MOSFET serves as a floating gate, and wherein the top plate of the stacked capacitor serves as a control gate in the number of non volatile memory cells.

23. The non volatile memory array of claim 19, wherein the array of non volatile memory cells includes an array of electrically erasable and programmable read only memories (EEPROMs).

24. The non volatile memory array of claim 19, wherein the array of non volatile memory cells includes an array of flash memory cells.

25. An electronic system, comprising:
a processor;
a dynamic random access memory (DRAM) chip; and a system bus coupling the processor to the DRAM chip, wherein the DRAM chip includes a non volatile memory array, and wherein the non volatile memory array includes:
  a number of non volatile memory cells wherein each non volatile memory cell includes:
    a MOSFET formed in a semiconductor substrate;
    a stacked capacitor, wherein the stacked capacitor is formed above the MOSFET by an insulator layer; and
    an electrical contact coupling a bottom plate of the stacked capacitor to a gate of the MOSFET through the insulator layer;
  a wordline coupled to a top plate of the stacked capacitor in the number of non volatile memory cells;
  a bit line coupled to a drain region of the MOSFET in the number of non volatile memory cells; and
  a sourceline coupled to a source region of the MOSFET in the number of non volatile memory cells wherein the bottom plate of the stacked capacitor is cup shaped having interior walls and is separated by a dielectric layer from a top plate of the capacitor, wherein the dielectric layer is conformal to the bottom plate, and wherein the top plate is conformal to the dielectric layer, a portion of the top plate being located within the interior walls of the bottom plate.

26. The electronic system of claim 25, wherein the electrical contact includes a polysilicon plug.

27. The electronic system of claim 25, wherein the MOSFET includes a gate oxide which has a thickness of less than 100 Å $SiO_2$.

28. The electronic system of claim 25, wherein the top plate of the stacked capacitor server as a control gate, and wherein a gate for the MOSFET serves as a floating gate for the number of non volatile memory cells.

29. The electronic system of claim 28, wherein a capacitive coupling ratio (C1/C2) of a capacitance between the control gate and the floating gate (C1) of the MOSFET is greater than 1.0 in the number of non volatile memory cells.

30. An electronic system, comprising:
  a processor;
  a dynamic random access memory (DRAM) chip; and
  a system bus coupling the processor to the DRAM chip, wherein the DRAM chip includes a non volatile memory array, and wherein the non volatile memory array includes:
    a number of non volatile memory cells wherein each non volatile memory cell includes:
      a MOSFET formed in a semiconductor substrate;
      a stacked capacitor, wherein the stacked capacitor is separated from the MOSFET by an insulator layer; and
      an electrical contact coupling a bottom plate of the stacked capacitor to a gate of the MOSFET through tie insulator layer;
    a wordline coupled to a top plate of the stacked capacitor in the number of non volatile memory cells;
    a bit line coupled to a drain region of the MOSFFT in the number of non volatile memory cells; and
    a sourceline coupled to a source region of the MOSFET in the number of non volatile memory cells, wherein the stacked capacitor includes a double sided stacked type capacitor structure having at least one roughened surface.

31. An electronic system, comprising:
  a processor;
  a dynamic random access memory (DRAM) chip; and
  a system bus coupling the processor to the DRAM chip, wherein the DRAM chip includes a non volatile memory array, and wherein the non volatile memory array includes:
    a number of non volatile memory cells wherein each non volatile memory cell includes:
      a MOSFET formed in a semiconductor substrate;
      a stacked capacitor, wherein the stacked capacitor is separated from the MOSFET by an insulator layer; and
      an electrical contact coupling a bottom plate of the stacked capacitor to a gate of the MOSFET through the insulator layer;
    a wordline coupled to a top plate of the stacked capacitor in the number of non volatile memory cells;
    a bit line coupled to a drain region of the MOSFET in the number of non volatile memory cells; and
    a sourceline coupled to a source region of the MOSFET in the number of non volatile memory cells, wherein the stacked capacitor includes a fin type capacitor structure ,wherein the fin type capacitor structure includes opposing sides, each of the opposing sides including multiple plates, the multiple plated being separated by a dielectric layer.

32. A method for forming a non volatile memory cell on a DRAM chip, comprising:
  forming a metal oxide semiconductor field effect transistor (MOSFET) in a substrate on the DRAM chip;
  forming a stacked capacitor above a gate of the MOSFET using a DRAM process, wherein the stacked capacitor is separated by an insulator layer from the MOSFET; and
  forming an electrical contact such that the electrical contact couples a bottom plate of the stacked capacitor to the gate of the MOSFET through the insulator layer, wherein forming a stacked capacitor includes forming a stacked capacitor having a cup-shaped bottom plate with interior walls, a capacitor dielectric conformal to the bottom plate, and a top plate conformal to the capacitor, and wherein a portion of the top plate is located within the interior walls of the bottom plate.

33. The method of claim 32, wherein forming an electrical contact includes forming a polysilicon plug.

34. The method of claim 32, wherein forming a MOSFET includes forming an n-channel metal oxide semiconductor (NMOS) transistor.

35. A method for forming a non volatile memory array on a DRAM chip, comprising:
  forming a plurality of metal oxide semiconductor field effect transistors (MOSFETs) in a semiconductor substrate on the DRAM chip;
  forming a plurality of stacked capacitors in an insulator layer above a gate for each of the plurality of MOSFETs;
  electrically coupling a bottom plate for each of the plurality of stacked capacitors to the gates of each of the plurality of the MOSFETs using a contact plug formed according to a DRAM process technology;
  coupling a wordline to the top plate for each of the stacked capacitors in the plurality of stacked capacitors;
  coupling a bit line to a drain region for each of the MOSFETs in the plurality of MOSFETs; and coupling a sourceline a source region for each of the MOSFETs in the plurality of MOSFETs, wherein forming a plurality of stacked capacitors includes forming a plurality of stacked capacitors each having a cup-shaped bottom plate with interior walls, a capacitor dielectric conformal to the bottom plate, and a top plate conformal to the capacitor, and wherein a portion of the top plate is located within the interior walls of the bottom plate.

36. A method for operating a memory cell, comprising:

controlling a charge placed on a gate of a metal oxide semiconductor field effect transistor (MOSFET) and placed on a bottom plate of a stacked capacitor which is formed above the MOSFET and is coupled to the gate by an electrical contact through an insulator; and wherein controlling the charge placed on the gate and on the bottom plate regulates a threshold voltage (Vt) for the memory cell, wherein the bottom plate of the stacked capacitor is cup shaped having interior walls and is separated by a dielectric layer from a top plate of the capacitor, wherein the dielectric layer is conformal to the bottom plate, and wherein the top plate is conformal to the dielectric layer, a portion of the top plate being located within the interior walls of the bottom plate.

37. The method of claim 36, wherein the method further includes:

applying a potential to the top plate of the stacked capacitor; and detecting a current flow between a first diffused region and a second diffused region in the MOSFET.

38. A method for operating a memory device, comprising:

placing a charge on a gate of a metal oxide semiconductor field effect transistor (MOSFET) and placing a charge on a bottom plate of a stacked capacitor, wherein the stacked capacitor is formed above the MOSFET by an insulator layer, wherein the bottom plate of the stacked capacitor is cup shaped having interior walls and is separated by a dielectric layer from a top plate of the capacitor, wherein the dielectric layer is conformal to the bottom plate, and wherein the top plate is conformal to the dielectric layer, a portion of the top plate being located within the interior walls of the bottom plate, and wherein an electrical contact couples the bottom plate of the stacked capacitor to the gate of the MOSFET through the insulator layer;

applying a potential to the top plate of the stacked capacitor; and detecting a current flow between a first diffused region and a second diffused region in the MOSFET.

39. A method for programming a memory device, comprising:

grounding a source region for a metal oxide semiconductor field effect transistor (MOSFET);

applying a control gate voltage to a top plate of a stacked capacitor formed in an insulator layer separating the stacked capacitor from the MOSFET, wherein the capacitor is formed above the MOSFET, wherein the stacked capacitor includes a bottom plate separated by a capacitor dielectric from the top plate, wherein the bottom plate of the staked capacitor is cup shaped having interior walls and is separated by a dielectric layer from the top plate of the capacitor, wherein the dielectric layer is conformal to the bottom plate, and wherein the top plate is conformal to the dielectric layer, a portion of the top plate being located within the interior walls of the bottom plate, and wherein the bottom plate is electrically coupled by an electrical via through the insulator layer to a gate of the MOSFET;

applying a drain voltage of approximately half the control gate voltage to a drain region of the MOSFET; and wherein an electrical charge is placed on the gate of the MOSFET and the bottom plate of the stacked capacitor.

40. A method for programming a memory device, comprising:

applying a voltage potential to a source region for a metal oxide semiconductor field effect transistor (MOSFET);

grounding a top plate of a stacked capacitor formed in an insulator layer separating the stacked capacitor from the MOSFET, wherein the capacitor is formed above the MOSFET, wherein the stacked capacitor includes a bottom plate separated by a capacitor dielectric from the top plate, wherein the bottom plate of the stacked capacitor is cup shaped having interior walls and is separated by a dielectric layer from the top plate of the capacitor, wherein the dielectric layer is conformal to the bottom plate, and wherein the top plate is conformal to the dielectric layer, a portion of the top plate being located within the interior walls of the bottom plate, and wherein the bottom plate is electrically coupled by an electrical via through the insulator layer to a gate of the MOSFET;

disconnecting a drain region of the MOSFET from a voltage supply; and wherein an electrical charge is removed from the gate of the MOSFET and removed from the bottom plate of the stacked capacitor.

* * * * *

UNITED STATES PATENT AND TRADEMARK OFFICE
CERTIFICATE OF CORRECTION

PATENT NO. : 6,380,581 B1
DATED : April 30, 2002
INVENTOR(S) : Noble et al.

It is certified that error appears in the above-identified patent and that said Letters Patent is hereby corrected as shown below:

<u>Title page,</u>
Item [56], References Cited, OTHER PUBLICATIONS, delete "(DDS)" and insert -- (DSS) --, therefor.

<u>Column 1,</u>
Line 17, delete "ConstructuDram Technology Compatible Non Volatile Memory Cells" and insert -- Construction and application for non-volatile, reprogrammable switches" --, therefor.
Line 66, before "charge" delete "a".

<u>Column 2,</u>
Line 47, delete "plate," and insert -- plate. --, therefor.
Line 52, delete "Modem" and insert -- Modern --, therefor.

<u>Column 5,</u>
Line 45, delete "the-control" and insert -- the control --, therefor.

<u>Column 7,</u>
Line 56, delete "salicded" and insert -- salicided --, therefor.

<u>Column 8,</u>
Line 26, before "120'" delete "capacitor" and insert -- Capacitor --, therefor.
Line 33, delete "121A" and insert -- 121A' -- therefor.
Line 38, delete "locate" and insert -- located --, therefor.

<u>Column 12,</u>
Line 33, after "shown" insert -- , --.
Line 60, delete "etc," and insert -- etc., --, therefor.

<u>Column 14,</u>
Lines 2 and 32, delete "comprising;" and insert -- comprising: --, therefor.
Line 22, delete "nonvolatile" and insert -- non volatile --, therefor.

<u>Column 15,</u>
Line 56, after "100 Å" insert -- of --.

<u>Column 16,</u>
Line 6, delete "A" and insert -- An --, therefor.

UNITED STATES PATENT AND TRADEMARK OFFICE
CERTIFICATE OF CORRECTION

PATENT NO. : 6,380,581 B1
DATED : April 30, 2002
INVENTOR(S) : Noble et al.

It is certified that error appears in the above-identified patent and that said Letters Patent is hereby corrected as shown below:

Column 17,
Line 5, after "cells" insert -- , --.
Line 20, after "cells" insert -- , --.
Line 34, delete "server" and insert -- serves --, therefor.
Line 39, after "(C1)" insert -- to a capacitance between the floating gate and a channel region (C2) --.
Line 57, delete "tie" and insert -- the --, therefor.

Column 18,
Line 25, delete "structure ,wherein" and insert -- structure, wherein --, therefor.
Line 27, delete "plated" and insert -- plates --, therefor.

Signed and Sealed this

Twenty-ninth Day of October, 2002

*Attest:*

*Attesting Officer*

JAMES E. ROGAN
*Director of the United States Patent and Trademark Office*